United States Patent

Vannatta et al.

[11] Patent Number: 5,539,360
[45] Date of Patent: Jul. 23, 1996

[54] DIFFERENTIAL TRANSMISSION LINE INCLUDING A CONDUCTOR HAVING BREAKS THEREIN

[75] Inventors: Louis J. Vannatta, Crystal Lake; James P. Phillips, Lake in the Hills; Eric L. R. Krenz, Crystal Lake, all of Ill.

[73] Assignee: Motorola, Inc., Schaumburg, Ill.

[21] Appl. No.: 209,336

[22] Filed: Mar. 11, 1994

[51] Int. Cl.$^6$ .................................................. H01P 3/04
[52] U.S. Cl. .......................... 333/4; 333/236; 174/117 FF
[58] Field of Search ................................ 333/1, 4, 5, 236; 174/117 F, 117 FF, 268

[56] References Cited

U.S. PATENT DOCUMENTS

| | | | |
|---|---|---|---|
| 3,634,808 | 6/1972 | Morrison | 174/117 F X |
| 4,707,671 | 11/1987 | Suzuki et al. | 333/5 X |
| 4,891,616 | 1/1990 | Renken et al. | 333/236 |
| 5,084,864 | 1/1992 | Turnbull et al. | 333/4 X |
| 5,304,959 | 4/1994 | Wisherd et al. | 333/26 |

Primary Examiner—Benny Lee
Attorney, Agent, or Firm—Kirk W. Dailey; Randall S. Vaas

[57] ABSTRACT

A transmission line has a limited cross-section, a transmission line geometry and an improved characteristic impedance tolerance. The transmission line geometry utilizes a unique combination of broadside coupling and coplanar coupling with a reflector plate in order to improve the tolerance of the characteristic impedance. First, a larger coplanar gap is used to reduce the etching error. Second, the inner dielectric thickness sensitivities were also reduced by relying on broadside coupling and coplanar coupling to determine the characteristic impedance of the transmission line. Third, the effect of registration error in the broadside coupling is eliminated by rendering the two signal bearing conductors on the same layer.

9 Claims, 3 Drawing Sheets

BROADSIDE COUPLED TRANSMISSION LINE

COPLANAR TRANSMISSION LINES

TABLE 1

| Δ WIDTH OF CONDUCTOR, mm | 0 | −0.035 | −0.035 | +0.035 | +0.035 |
|---|---|---|---|---|---|
| Δ THICK OF DIELECTRIC, % | 0 | +15% | +15% | −15% | −15% |
| Δ REGISTRATION, mm | 0 | 0 | −0.025 | 0 | −1.0 |
| Z FOR 50 ohm CCS | 50.0 | 58.6 | 57.8 | 42.4 | 42.4 |
| % CHANGE IN Z | 0 | +17.2 | +15.6 | −15.2 | −15.2 |

BROADSIDE TOLERANCES: X x 50Ω

ETCH AND DIELECTRIC

TABLE 1 — 801

| LINE ETCH ±1mm EACH SIDE / DIELECTRIC | OVER 0.34mm | NOM 0.39mm | UNDER 0.44mm |
|---|---|---|---|
| THIN 0.100mm | -7.5% | -15% | -24.5% |
| NOMINAL 0.125mm | +11% | 0% | -10.5% |
| THICK 0.150mm | +27% | +15% | +5% |

BROADSIDE TOLERANCES: X x 50Ω

ETCH AND REGISTRATION

TABLE 2 — 803

| LINE ETCH / REGISTRATION | OVER 0.34mm | NOM 0.39mm | UNDER 0.44mm |
|---|---|---|---|
| NOMINAL 0.000mm | +14% | 0% | -8% |
| OFFSET 0.063mm | +17% | +15% | -6% |

*FIG. 8*

—PRIOR ART—

DIFFERENTIAL TRANSMISSION LINE INCLUDING A CONDUCTOR HAVING BREAKS THEREIN

FIELD OF THE INVENTION

Generally, the present invention relates to transmission lines, and, more specifically, to balanced transmission lines having a small cross-section and methods of designing the same.

Background of the Invention

Generally, balanced transmission lines are used to differentially transmit radio frequency (RF) signals between two circuits. A tranverse electric and magnetic (TEM) transmission line traditionally contains at least two conductors for transmitting the RF signal. The geometries of the two conductors and the use of a dielectric material determines the characteristic impedance and quality of the transmission line. In the past, geometries such as a broadside-coupled transmission line, illustrated in FIG. 1, a coplanar transmission line, illustrated in FIG. 2, and a micro strip transmission line, illustrated in FIG. 3, have been used for particular applications as transmission lines. The microstrip transmission line 300 of FIG. 3 includes a narrow first conductor 301 and a wider second conductor 303. The first conductor 301 is parallel to and raised from a plane formed from the second conductor 303 and positioned about the center of the second conductor 303. The first conductor 301 and the second conductor 303 are disposed within a dielectric material 305. However, when attempting to use these particular geometries in a transmission line having a limited cross-section, these traditional geometries, illustrated in FIGS. 1–3, failed to provide a transmission line having a characteristic impedance within a desired range. The cross-section refers to the height and width of the transmission line geometry. These three geometries fail to have a tolerant characteristic impedance due to manufacturing variations of conductor pattern etch, conductor pattern registration, and dielectric laminate thickness. Additionally, the micro strip transmission line is an unbalanced transmission line. Thus, it would be advantageous to provide a transmission line having limited cross-section with a characteristic impedance within a desired range, and is easily manufacturable.

BRIEF DESCRIPTION OF THE DRAWINGS

FIG. 7 is an illustration of a table containing tolerances measured of a transmission line geometry in accordance with the present invention.

FIG. 8 is an illustration of two tables containing tolerances measured from a prior art transmission line geometry.

DESCRIPTION OF A PREFERRED EMBODIMENT

A preferred embodiment of the present invention encompasses a transmission line geometry having an improved characteristic impedance tolerance for a transmission line having a limited cross-section. The transmission line geometry utilizes a unique combination of broadside coupling and coplanar coupling with a reflector plate in order to improve the tolerance of the characteristic impedance. First, a larger coplanar gap is used to reduce the etching error. Second, the inner dielectric thickness sensitivities were also reduced by relying on broadside coupling and coplanar coupling to determine the characteristic impedance of the transmission line. Third, the effect of registration error in the broadside coupling is eliminated by rendering the two signal bearing conductors on the same layer.

Figure 1:
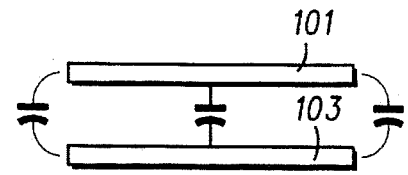
FIG. 1 is an illustration of a broad-side transmission line geometry that is prior art.

A broadside coupled transmission line geometry, such as that illustrated in FIG. 1, has a characteristic impedance that is sensitive to the thickness of the dielectric material between the first conductor 101 and the second conductor 103, the registration offset between the first conductor 101 and the second conductor 103, and the width of the first conductor 101 and the second conductor 103. Table 801 of FIG. 8 illustrates the broadside transmission line geometry tolerance to inaccuracies in etching or line width and the dielectric for a 50 ohm transmission line, having a desired conductor width of 0.39 millimeters, and a dielectric thickness of 0.125 millimeters. As can be seen from table 801, the broadside transmission line geometry varies by approximately −24.5% to +27% due to the variances. Table 803 of FIG. 8 illustrates a relationship of the tolerance of the broadside transmission line geometry to fluctuations in the width of the conductors and the offset registration between the first conductor 101 and the second conductor 103. As can be seen from the table 803, broadside transmission line geometry varies between −8% to +17% for the given registration offset.

Figure 2:
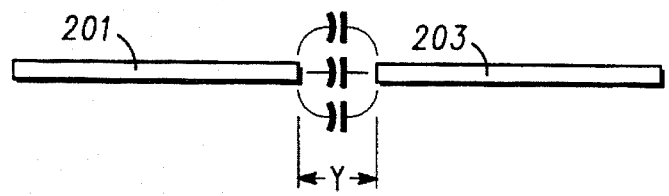
FIG. 2 is an illustration of a coplanar transmission line geometry that is prior art.
Figure 3:
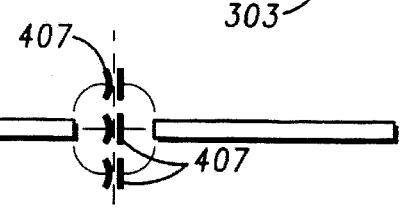
FIG. 3 is an illustration of a micro strip transmission line geometry that is prior art.

The coplanar transmission line geometry as illustrated in FIG. 2 fails to provide a transmission line of 50 ohms when the design criteria requires an overall width of the transmission line less than 1.6 millimeters. The reason it fails is that a 50 ohm transmission line having conductor width of 1.6 millimeters requires a coplanar gap of 0.025 millimeters. A gap of this width is difficult to manufacture with currently available technology for our given application. The coplanar gap is illustrated in FIG. 2 as the distance between the first conductor 201 and the second conductor 203, and designated as Y in FIG. 2.

Figure 4:
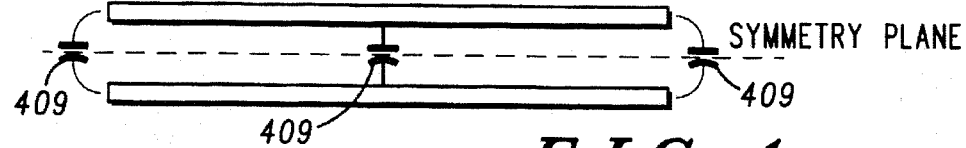
FIG. 4 is an illustration of the symmetry planes used in accordance with the present invention.

In order to overcome the shortfalls of the existing transmission line geometries, a new transmission line geometry was invented which utilized characteristics from both the broadside transmission line geometry and the coplanar transmission line geometry. Part 1 of FIG. 4 is an illustration of the symmetry plane from the coplanar transmission line geometry that is adopted by the new transmission line geometry. The conductors of Part 1 are edge coupled as illustrated by capacitors 407. Part 2 of FIG. 4 is an illustrate of the symmetry plane from the broadside transmission line geometry that is adopted by the new transmission line geometry. The conductors of Part 2 are broadside coupled as illustrated by capacitors 409. Symmetry is defined as correspondence in size, shape, and relative position of parts on opposite sides of a dividing line or median plane or about a center or axis. The symmetry planes of part 1 and part 2 of FIG. 4 are incorporated into a single symmetry plane in the geometry described in FIG. 5.

Figure 5:
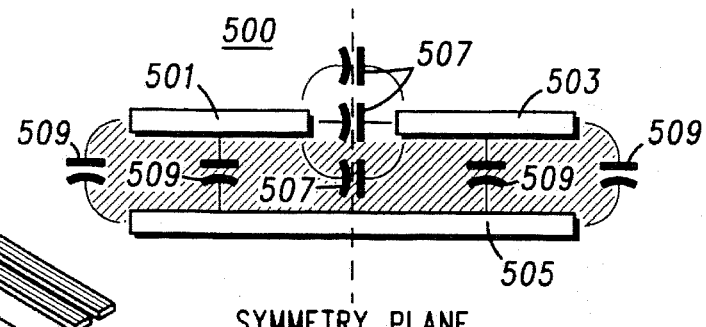
FIG. 5 is an illustration of a transmission line in accordance with the present invention.

FIG. 5 is an illustration of a transmission line geometry 500 in accordance with the present invention. The transmission line geometry 500 includes a first conductor 501, a second conductor 503, and a third conductor 505. The first conductor 501 and the second conductor 503 are edge coupled as in a traditional coplanar geometry as shown by capacitances 507 in FIG. 5. Additionally., the first conductor 501 and the second conductor 503 are broadside coupled using the third conductor 505 as a reflector plate, as illustrated by the capacitances 509 shown in FIG. 5. The effective broadside height is equal to twice the distance between the third conductor 505 and a plane formed of the first conductor 501 and the second conductor 503. In the preferred embodiment, the first conductor 501 and the second conductor 503 are used to carry radio frequency signals between a radio receiver and an antenna. The third conductor 505 is a floating conductor used to contain the electric fields between the first conductor 501 and the second conductor 503; thereby reflecting an image of the conductors 501, 503. Often, the third conductor is referred to as a reflector plate. Typically, the space between the third conductor 505 and the plane of the first conductor 501 and the second conductor 502 is filled with a dielectric material. Alternatively, the space may be left empty. In the preferred embodiment, the dielectric material is a flexible circuit board material having a dielectric constant, $\varepsilon r$, equal to 3.4.

Additionally, the third conductor 505 contains periodic discontinuities along its length to suppress any undesirable transmission modes, such as transverse electric (TE), transverse magnetic (TM), or transverse electric magnetic (TEM). The periodic discontinuities are realized by breaking the third conductor along its length. The electrical distance between the periodic discontinuities should be less than one-quarter of the wavelength of the highest frequency to be transmitted on the transmission line 500. In the preferred embodiment, the periodic discontinuities occur every one-tenth wavelength of the highest frequency transmitted on the transmission line. The highest frequency transmitted is 1.5 Gigahertz (GHz).

FIG. 7 is a table illustrating the results of the new transmission line geometry for various tolerances for a 50 ohm transmission line. The first column is for a width variation of 0, a thickness variation of 0 and a registration variation of 0, meaning the transmission line is to a design specification, which in this example, has a real impedance Z of 50 Ohms. The second column is a conductor, having a width 0.035 mm less than the design specification and a thickness 15% over specification, resulting in a Z equal to 58.6 Ohms, 17.2% different than Z in column 1. The third column is a conductor having a width 0.035 mm less than specification, a thickness 15% over specification, and a registration 0.025 less than specification, resulting in a Z equal to 57.8 Ohms, 15.6% greater than the specification impedance in column 1. The forth column is a conductor having a width 0.035 mm greater than specification, and a thickness 15% less than specification, resulting in a Z equal to 42.4 Ohms, 15.2% less than the specification impedance in column 1. The fifth column is a conductor having a width 0.035 mm greater than specification, a thickness 15% less than specification, and a registration 1.0 mm less than specification, resulting in a Z equal to 42.4 Ohms, 15.2% less than the specification impedance in column 1. For the given tolerances, the characteristic impedance varies −15.2 and +17.2% as compared to the broadside tolerance which varies between −24.5% to +27%. Thus, the new transmission line geometry allows for a more error tolerant transmission line design for small cross-sections.

Figure 6:
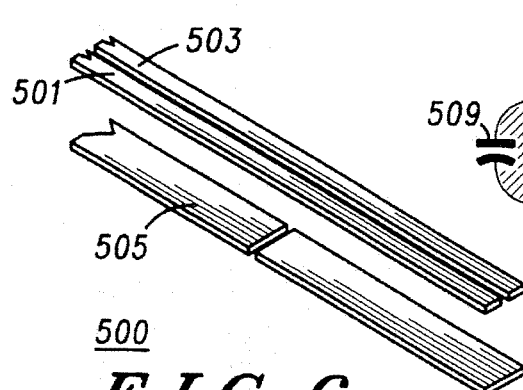
FIG. 6 is a perspective view illustration of the transmission line of FIG. 5 in accordance with the present invention.

In order to design a transmission line using this geometry, the following process should be followed. First, one determines a desired physical cross-section of the transmission line including both the height and the width of the transmission line. In the preferred embodiment, the overall height could not exceed 0.311 millimeters, the inner dielectric was limited to 0.100 millimeters, and the width of the transmission line could not exceed 1.6 millimeters. Second, one determines a desired transmission line characteristic impedance, zod. In the preferred embodiment, the desired characteristic impedance, zod, is equal to 50 ohms. Third, one determines the highest frequency of transmission to be used on the transmission line, and its corresponding wavelength in the transmission line. In the preferred embodiment, the highest desired frequency of transmission is 1.5 GHz, which has a corresponding wavelength in the transmission line equal to 110 mm. Fourth, one chooses a coplanar gap spacing Y between the first conductor 501 and the second conductor 503. The coplanar gap should be chosen to be as small as is convenient given the current manufacturing technologies. The coplanar gap should generate a coplanar characteristic impedance $z_{oc}$ which is greater than the desired characteristic impedance $z_{od}$. In the preferred embodiment, the coplanar gap Y was chosen to be equal to 0.25 mm. Using the coplanar gap Y and the overall width of the transmission line, one calculates the maximum equal widths of the first conductor 501 and the second conductor 503. In the preferred embodiment, the width of the first conductor 501 and the second conductor 503 are equal to 0.55 min. Fifth, one calculates a broadside height between the first conductor 501 and the second conductor 503 such that the following equation is satisfied.

$$1/z_{od}=1/z_{oc}+1/z_{ob}$$

wherein $z_{ob}$ is the broadside characteristic that is defined by the broadside height. This equation is a rough estimate of the effective impedance of the resulting transmission line. In the preferred embodiment, the broadside height is equal to 0.200 mm. Sixth, one sets the distance between the third conductor 505 and the plane of the first conductor 501 and the second conductor 503 equal to one-half the calculated broadside height. Seventh, one builds the calculated geometry, then finely adjusts the dimensions to get the desired characteristic impedance. Most likely, the estimate, as a result of solving the above equation, will give you a lower characteristic impedance than the desired characteristic impedance, zod. Before manufacturing the calculated geometry, accurate modeling can be done by using a high frequency structure simulator, such as the High Frequency Structure Simulator 85180A available from Hewlett Packard. As an optional step, one may design periodic discontinuities along the length of the third conductor 505. These periodic discontinuities or breaks in the third conductor 505 should be spaced less than one-quarter of the wavelength of the highest frequency to be transmitted along the transmission line 500. In the preferred embodiment, the periodic discontinuities were spaced one-tenth of a wavelength of the highest frequency to be transmitted on the transmission line 500 (20 mm). The breaks are clearly illustrated in FIG. 6. FIG. 6 is an illustration of a perspective view of the transmission lien 500 of FIG. 5; including the first conductor 501, the second conductor 503 and the third conductor 505.

What is claimed is:

1. A transmission line for transmitting a desired signal having a maximum frequency, the maximum frequency having a first wavelength, the transmission line comprising:

a first conductor having a first predetermined width and disposed in a first plane;

a second conductor substantially parallel to the first conductor, the second conductor being disposed in the first plane so as to be coplanar with and separated from the first conductor, and the second conductor having a second predetermined width; and a third conductor spaced from and substantially parallel to the first plane, the third conductor having a third predetermined width, and the third conductor having a length, the third conductor having breaks at respective distances along the length of the third conductor, the respective distances between corresponding breaks being much less than ¼ of the first wavelength of the maximum frequency.

2. A transmission line in accordance with claim 1 wherein the third predetermined width is greater than the sum of the first predetermined width and the second predetermined width.

3. A transmission line in accordance with claim 1 wherein the third conductor is spaced from the first plane by a first height X.

4. A transmission line in accordance with claim 3 wherein the first conductor is separated from the second conductor by a first coplanar gap spacing Y.

5. A transmission line in accordance with claim 1 wherein a dielectric material is disposed between the first plane and the third conductor.

6. A transmission line in accordance with claim 1 wherein the desired signal is differentially transmitted by the first conductor and the second conductor.

7. A transmission line in accordance with claim 6 wherein the third conductor is a reflector plate for the first conductor and the second conductor.

8. A transmission line in accordance with claim 1 wherein the transmission line is a balanced transmission line.

9. A transmission line in accordance with claim 1 wherein the respective distances are equal to ⅒ of the first wavelength of the maximum frequency.

* * * * *